United States Patent [19]

Germer et al.

[11] Patent Number: 4,491,793

[45] Date of Patent: Jan. 1, 1985

[54] DETACHABLE MAGNETIC COUPLER COMMUNICATION APPARATUS

[75] Inventors: Warren R. Germer, Dover; Ansell W. Palmer, Hampton, both of N.H.

[73] Assignee: General Electric Company, Somersworth, N.H.

[21] Appl. No.: 533,895

[22] Filed: Sep. 21, 1983

Related U.S. Application Data

[63] Continuation of Ser. No. 190,217, Sep. 24, 1980, abandoned.

[51] Int. Cl.³ .......................... G01D 5/06; G01D 5/26

[52] U.S. Cl. .................................... 324/157; 250/239; 346/14 MR

[58] Field of Search ................ 324/113, 157; 250/239, 250/551; 346/14 MR; 455/602, 613; 340/870.28; 350/96.2

[56] References Cited

U.S. PATENT DOCUMENTS 4,298,839 11/1981 Johnston ............................ 324/157

FOREIGN PATENT DOCUMENTS 1217593 8/1969 United Kingdom ................ 250/239

1330076 11/1972 United Kingdom .

*Primary Examiner*—Gerard R. Strecker

*Assistant Examiner*—Walter E. Snow

*Attorney, Agent, or Firm*—Robert E. Brunson

[57] ABSTRACT

Disclosed is a meter cover (housing) mounted receptacle and detachable magnetic coupler incorporating optical communication devices for electronically communicating with electronic circuitry housed within the meter cover.

5 Claims, 9 Drawing Figures

32
62
66
46
48
49
50
46
66
66

12
56
58
52
44
42
50
46
48
49
40
44
38
50
51
26
54
30
66
64
34
72
70
36
68
32
24
60

32
36'
36"
62
64
74

38"
38'
48
48
46

90
96
80'
80'
102
28
92

94
78
96
90
88
84
80
82
88
86
76
92
22
98
100
102
28

100
100
98
100
102
28

49
48
24
52
58
56
12
26
54
32
94
64
96
90
74
88
80
22
28
102

DETACHABLE MAGNETIC COUPLER COMMUNICATION APPARATUS

This application is a continuation of application Ser. No. 190,217, filed 9/24/80 now abandoned.

BACKGROUND OF THE INVENTION

The present invention relates generally to communication coupler devices and more particularly to such devices having magnetic and optical characteristics which allow mating magnetic couplers to be joined for the transfer of information between electronic devices.

The present invention finds use in most any type of application where it is desirable or necessary to electronically communicate with electronic circuitry which is in-accessibly housed, such as in a sealed enclosure. To this end, and as a preferred embodiment, the invention finds particular application in utility meters of the computerized electronically programmable type. These types of meters are most frequently designed to be programmed or re-programmed at the place of installation, such as at the customer residence, or a commercial business site. Ideally, these types of meters are designed for electronic readout of meter data (eg. total kilowatt hours consumption, demand kilowatt consumption and the like).

Programming and reading of the above types of meters is normally done by a utility company meter reader or service person utilizing a portable programmer/reader device. This device is usually provided with some type of plug device for attachment to the meter to enable the programmer/reader to communicate with the electronics inside the meter cover.

The use of an optical coupler for programming meters of the above type is made attractive because of the economic design and manufacturing cost incentives such a coupler affords. A further attractive feature is the high reliability of the optical emitter and detector devices employed in such couplers.

It has been found, however, that optical emitter and detector devices, when coupled together for the communication of information, must be precisely aligned, as well as being substantially shielded to prevent ambient light from interfering with the optical communication link between the coupled devices. This precise alignment and light shielding are two problems which must be overcome in order to have a highly reliable optical communication coupler.

As far as it is known, the detachable part of all prior art type optical couplers must be held in place by hand while the coupler is in operation. This has the distinct disadvantage in that the person holding the coupler may unintentionally move the coupler during its operation, thus disrupting the communication link. Another disadvantage is that the person operating the coupler does not have both hands free to perform other needed operational tasks, such as operating the various switches and control typically found on a portable programmer/reader.

Therefore, a need exists for a detachable optical communication coupler device which can be economically manufactured and which provides excellent alignment and light shielding while freeing the hands of an operator to perform the necessary tasks for communicating between electronic devices.

SUMMARY OF THE INVENTION

The aforementioned problems and disadvantages are overcome by the present invention by the provision of a new and improved combination magnetic and optical communication coupler apparatus for use in electronically communicating with electronic circuitry inaccessibly housed within an enclosure from a source external of the enclosure. The invention, in a preferred embodiment, is advantageously applied in utility meters of the electronically programmable type, which can be externally programmed by a portable programmer/reader device.

In applying the apparatus of the invention, a first coupler assembly is rigidly mounted through a meter cover. This first coupler assembly may alternatively be constructed as a magnet, or fabricated from a magnetically inductive material. The coupler assembly contains a face portion which is mounted external of the meter cover. An aperture extends from this face portion into the coupler assembly. At least one optical communication means is disposed in the aperture, and is oriented therein to provide a communication path for the optical communication means through the aperture in the face portion of the coupler assembly. This optical communication means is connected to electronic circuitry inside the meter cover.

A second coupler assembly is provided for magnetic attachment to the first coupler assembly. This second coupler assembly may also be constructed as a magnet or fabricated of magnetically inductive material. At least one of the coupler assemblies, or both must be constructed as a magnet.

The second coupler contains a magnetized surface for mating magnetic attachment to the face portion of the first coupler assembly. In a manner similar to the first coupler assembly, the second coupler assembly also contains an aperture extending from its magnetized surface into the body of the second coupler for the containment of a second optical communication means. The orientation of the second optical communication means in the aperture of the second coupler assembly provides an optical communication path through the aperture for the establishment of a communication link between the first and second optical communication means when the two coupler assemblies are magnetically coupled. A portable programmer/reader is connected to the second optical communication means to complete communications with the meter electronic circuitry via the optical coupler assembly.

Alignment means is provided to insure precise optical coupling between the first and second optical communication means when the first and second coupler assemblies are magnetically coupled. A means is also provided to inhibit the entry of ambient light from entering between the coupled portions of the two couplers to further enhance the optical coupling.

It is therefore an object of the present invention to provide an optical coupling apparatus for the transfer of electronic information having enhanced structural and operational capabilities.

It is another object of the present invention to provide a magnetically detachable optical coupling apparatus characterized by a structure which provides precise optical alignment and light shielding to ensure error free transfer of information through an optical communication link established by the apparatus.

A still further object of the invention is to provide an optical coupling apparatus which allows communication with an electronic circuit inaccessibly housed within an enclosure from an electronic device or source external of the enclosure.

Still another object of the invention is to provide a combination magnetic and optical coupler apparatus for use in a meter system for electronically communicating with electronic circuitry housed within the cover of a meter from a portable electronic communication device connected external of the meter cover.

Yet another object of the invention is to provide a magnetic optical coupler which allows an operator of the preceding mentioned portable electronic communication device to have both hands free to operate the communication device while communicating with the electronic circuitry inside the meter cover.

It is another object of the present invention to provide a combination optical magnetic coupler apparatus which provides the capability of unidirectional or bi-directional communication with an electronically programmable meter from a programmer/reader connected external of a meter cover having electronics in-accessibly housed therein.

BRIEF DESCRIPTION OF THE DRAWING

The present invention may be more readily understood by reference to the accompanying drawing in which.

DESCRIPTION OF THE PREFERRED EMBODIMENT

Figure 1:
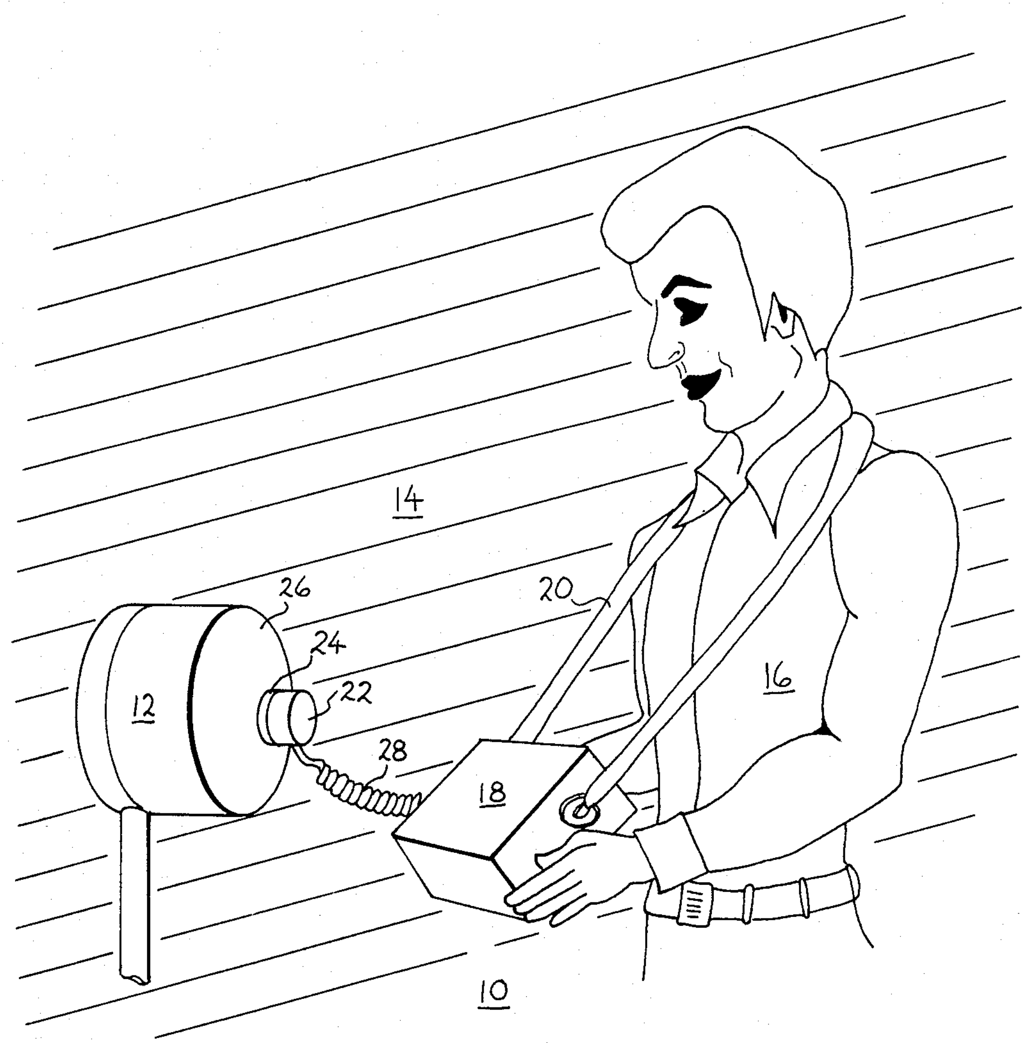
FIG. 1 is a pictorial drawing illustrating the magnetic optical coupler of the present invention in use by an operator of a portable programmer/reader device communicating with an electronically programmable meter.

Reference is now made to FIG. 1 which shows a metering system 10 illustrating the operation of the invention in its disclosed embodiment. A kilowatt hour meter 12 is shown attached to a customer residence, or utility users building 14 in a conventional manner known to the utility industry. To operate the invention, a utility service person or meter reader 16, carrying a portable programmer/reader device 18 suspended by a strap 20 around the meter reader's neck, approaches the residence 14. The meter reader 16 then attaches a magnetic optical reader apparatus or coupler 22 to a mating receptacle coupler or assembly 24 shown rigidly mounted through a portion of the meter cover such as at 26.

Optical communication devices in the mating coupler 24 are connected via wires to electronic circuitry (not shown) within the meter cover 12. In a similar manner, optical devices in the magnetic coupler assembly 22 are electrically connected to the programmer reader device 18 via a cable or conductor 28.

As can be seen in FIG. 1, the coupler devices 22 and 24 are held in place on the meter cover 12, thereby leaving both hands of the meter reader free to operate the programmer/reader 18. As will subsequently be seen, this hands off operation of the coupler apparatus of the present invention is made possible by the magnetic attachment characteristics of the apparatus, as well as alignment means provided on the apparatus which allows the coupler assemblies 22 and 24 to be easily attached in precise alignment whenever a meter is to be interrogated or programmed by the programmer/-reader 18.

Figure 2:
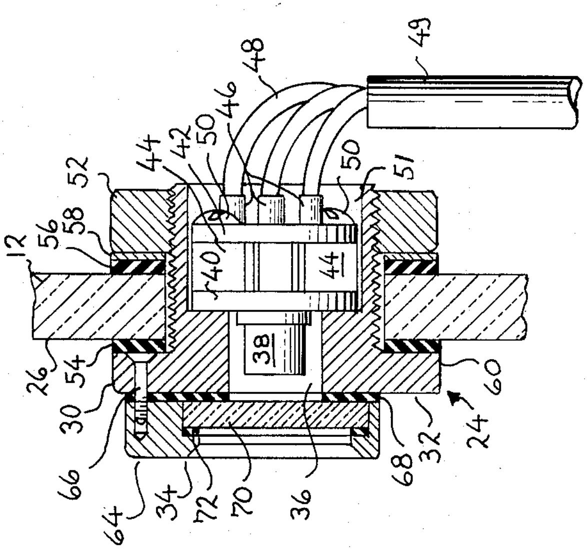
FIG. 2 is a side view, partly in cross-section, of a first coupler assembly of the present invention and showing that coupler assembly mounted to a meter cover or enclosure.

Reference is now made to FIG. 2 which shows the first coupler 24 of the present invention, in side view cross-section, attached to the face 26 of the meter cover 12. In its broadest context, the coupler 24 may be formed as an integral housing, or body generally shown as 30, of a magnetically inductive material. However, it is to be recognized that the receptacle or housing 24 may also be formed as a magnet. The structure of the housing 30 is characterized by a body 32 having a face portion 34 and further having at least one aperture 36 extending from the face portion 34 into the body 32.

Figure 4:
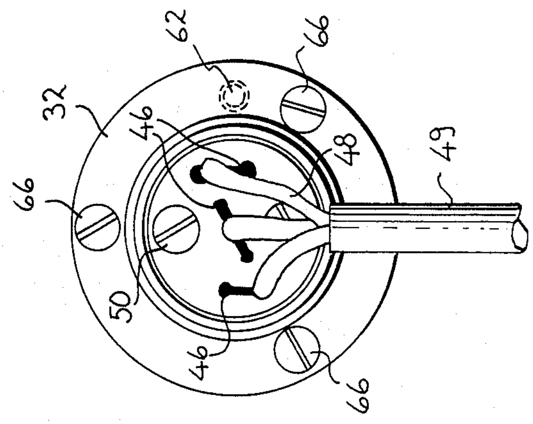
FIG. 4 is an end view showing a portion of the first coupler assembly of FIG. 2 looking into the right side thereof.

As shown in FIG. 2, the aperture 36 contains at least one optical communication means or device 38 held disposed in place by a circuit board shown as boards 40 and 42. The boards 40 and 42 are held displaced by two spacers generally shown as 44. The leads of the optical device 38 are brought through suitable holes in the boards 42 and 44 and soldered to the boards shown at connecting or conductor points 46 (see FIG. 4). Three conductors 48 of a cable 49 are soldered to these terminal connector points. The entire assembly, comprised of the optical device 38 and the circuit boards 42 and 44, is secured in place within a cavity 51 of the body 32 by two retaining screws 50 as shown in FIGS. 2 and 4. These screws 50 are passed through the spacers 44 and screwed into the body 32 through threads (not shown) in the body.

The entire first coupler assembly 24 is rigidly attached to the meter cover 12 by a nut 52 screwed on to the body 32 from the inside of the meter cover 12. To protect the inside of the meter from outside elements (such as moisture and dirt), two gaskets 54 and 56 are placed on the outside and inside respectively of the meter cover. Also, a flat washer 58 is placed between the gasket 56 and the nut 52 to prevent damage to the gasket as the nut 52 is tightened against the gasket. As an option to the present invention, as shown in the end views of FIGS. 3 and 4, the body 32 may have an alignment pin in the back side of an annular shoulder 60 which aligns with a mating hole in the meter cover 12 to prevent the coupler from turning and insure that the coupler 24 is properly oriented when installed. This alignment pin and its corresponding alignment hole is shown in dotted or hidden line form in FIGS. 3 and 4 as 62.

Still referring to FIG. 2, a portion of the body 32 includes a face cover 64, preferably fabricated from a soft iron magnetically inductive material compatible with that of the entire body 32. As shown in FIGS. 2 and 4, this cover 64 is attached to the body by three screws 66 threaded from the backside of the shoulder 60 into the backside of the cover 66. To complete the sealing arrangement of the coupler assembly, a gasket 68 is interposed between the shoulder 60 and the cover 64.

A light path is provided through the cover 64, which also has an opening or aperture in the face portion to allow light communication through the front of the cover with the optical device 38. For protection of the optical device 38, a transparent cover 70 is disposed within the cover 66. This transparent cover is preferably fabricated from a high impact plastic or glass substance impervious to breakage. The sealing arrangement of the coupler of FIG. 2 is further enhanced by means of another gasket 72 disposed between the glass 70 and a shoulder on the inside of the cover 66.

Figure 3:
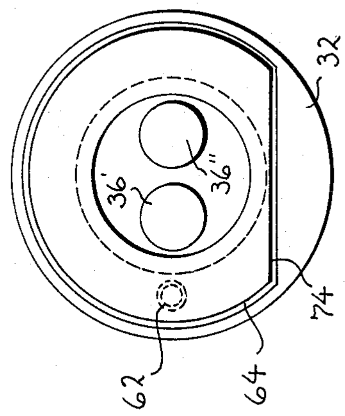
FIG. 3 is an end view showing a portion of the first coupler assembly of FIG. 2 looking into the left side thereof.

As best seen in FIG. 3, the body 32, and the cover 64 forming a part thereof, also includes a first alignment means 74 shown as a flat on the bottom side of the cover 64. As will subsequently be described, this alignment means is configured to symetrically align with a mating second alignment means on the detachable coupler 22.

Figure 9:
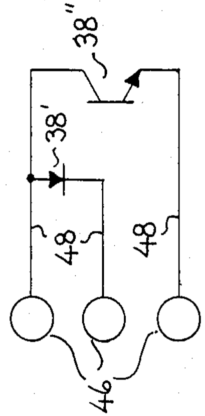
FIG. 9 is an electrical schematic showing the wiring of optical communication devices used in each of the first and second couplers of the present invention.

In the preferred embodiment where information is to be bi-directionally transferred, two apertures 36' and 36" are formed in the body 32 (see FIG. 3). Mounted within these latter two apertures are associated optical communication devices 38' and 38" shown in FIG. 9 as an emitter (such as a light emitting diode) and a collector such as a photocell 38" respectively. FIG. 9 schematically shows the wiring of cable 49 for connecting these optical communication devices to the circuit boards 42 and 44 at connecting points 46 of FIG. 4.

Figure 7:
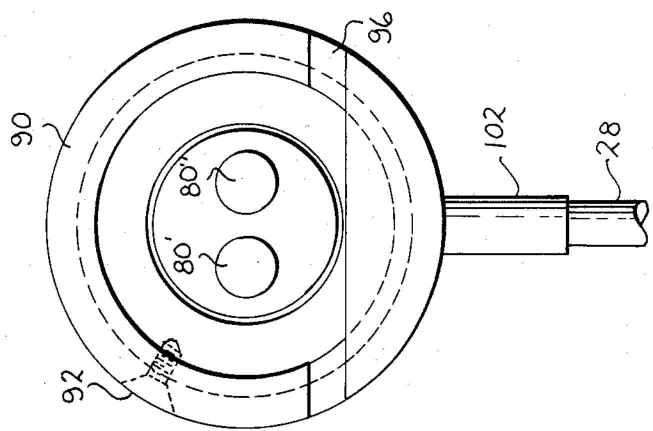
FIG. 7 is an end view showing a portion of the second coupler of FIG. 5 looking into the right side thereof.
Figure 5:
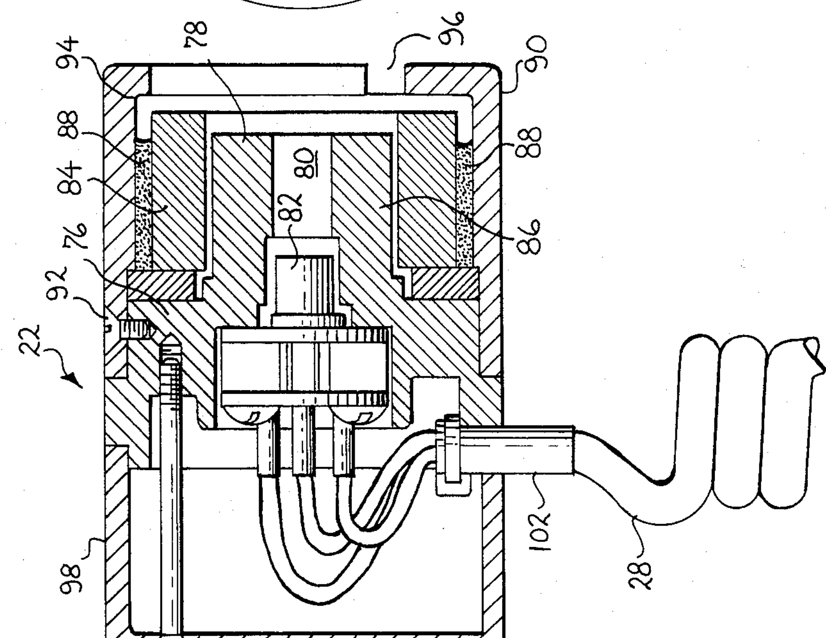
FIG. 5 is a side view, partly in cross-section, of a second coupler assembly of the present invention, for magnetic coupling to the first coupler assembly of FIG. 2 and showing a cable for connection to the programmer/reader of FIG. 1.
Figure 6:
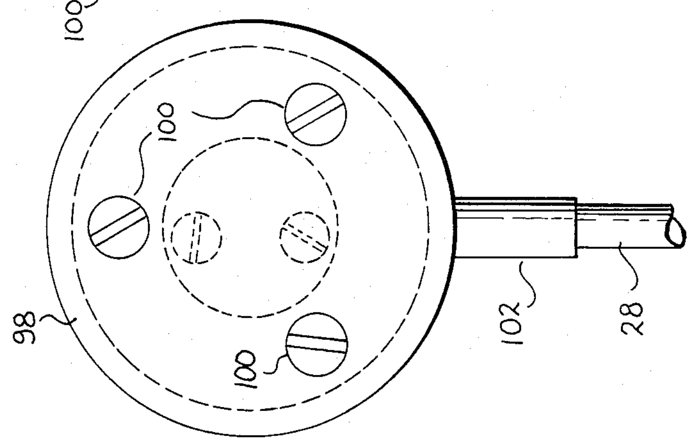
FIG. 6 is an end view showing a portion of the second coupler of FIG. 5 looking into the left side thereof.

Reference is now made to FIG. 5, showing a cross sectional side view of a second coupler of the invention such as coupler 22 of FIG. 1. As previously described in connection with FIG. 1, this coupler is magnetically attachable to the mating coupler 24. In its broadest context, the coupler 22 of FIG. 5 may be comprised of a unitary magnet structure. The structure of the coupler 22 is comprised of a magnetic body 76 having a face portion 78 preferably symetrically designed to mate with the face portion on the body 32 of the coupler 24 of FIG. 2. In a manner similar to the coupler 24 of FIG. 2, the coupler 22 also has an aperture 80 extending into a cavity from the face portion of the body 76 for the retention of at least one other optical communication device 82. If only unidirectional communication is desired, there would be only one optical communication device located within the aperture 80 of FIG. 5 and that device would communicate with a communication device of opposite type in the aperture 36 of the coupler 24 of FIG. 2. However, as previously described, if bidirectional communication is desired, two apertures such as 80' and 80" of FIG. 7 are formed in the body 76 to hold optical communication devices of opposite types similar to devices 38' and 38" (see FIG. 9). The mounting of optical communication devices, such as 82 of FIG. 5, within the body 76 is done in a similar manner to that described for FIG. 2. For that reason, a detailed description of how devices such as 82 or 38' and 38" are mounted, will not be given, as it is believed to be clearly shown by FIG. 5.

To form the structure of the second coupler assembly 22 of FIG. 5, a magnet 84 is disposed around a front annular shoulder portion 86 of the body 76. As shown at 88 in FIG. 5, the magnet 84 is preferably held in place by a suitable cement, such as epoxy, to rigidly attach the magnet 86 to the entire structure or body 76.

A cover 90, forming a part of the body 76 and magnet assembly 84, is attached to the body 76 by three countersunk screws 92, only one of which is shown in FIGS. 5 and 7. This cover is preferably of magnetic or inductively magnetic material and serves essentially four purposes. The first of these purposes is to provide a partial protective cover for the coupler assembly 22. The second purpose is to provide a light shield, as shown at 94, in the form of a lip extending out over the face portion end of the magnet and body assembly 76, 84. Thirdly, the cover 90 provides a second alignment means 96 formed as a flat in the face portion end of the lip of the light shield 94. The alignment means 96 is symetrically formed to coact with the flat 74 of the first alignment means shown in FIG. 3. And fourthly, the cover 90 serves as a return path of the magnetic flux, to thus improve the magnet holding force and increase the magnet retentivity.

The above mentioned return path is made possible by the structure of and the physical relationship between the magnet 84 and the cover 90. By virtue of this structural relationship, a closed loop magnetic circuit is formed wherein magnetic flux continuously flows between the magnet and the cover via the close inductive coupling (spacing) between the magnet and the cover as maintained by the cement at 88. It has been found that this structural relationship and the configurations of the magnet and the cover greatly increases the holding force of the magnet.

It should also be noted that the lip of the shield 94 also forms a part of the above mentioned closed loop magnetic circuit by virtue of the structural configuration of the lip and its relationship to the magnetized surface end of the magnet. This structural relationship enables the magnetic flux to flow across the air gap between the lip of the shield and the magnetized surface end of the magnet. The significance and purpose of this air gap and the flux flowing thereacross will subsequently be described.

To complete the coupler assembly 22 of FIG. 5, a second or rear cylindrical cover 98 is attached to body 76 by three screws 100 threaded into the body 76. As can be seen in FIG. 5, the purpose of cover 98 is to protect the wiring extending from the circuit board inside the coupler 22. The prevent fraying of the wiring on cable 28, a rubber protective grommet 102 is preferably installed between the body 76 and the cover 98.

Figure 8:
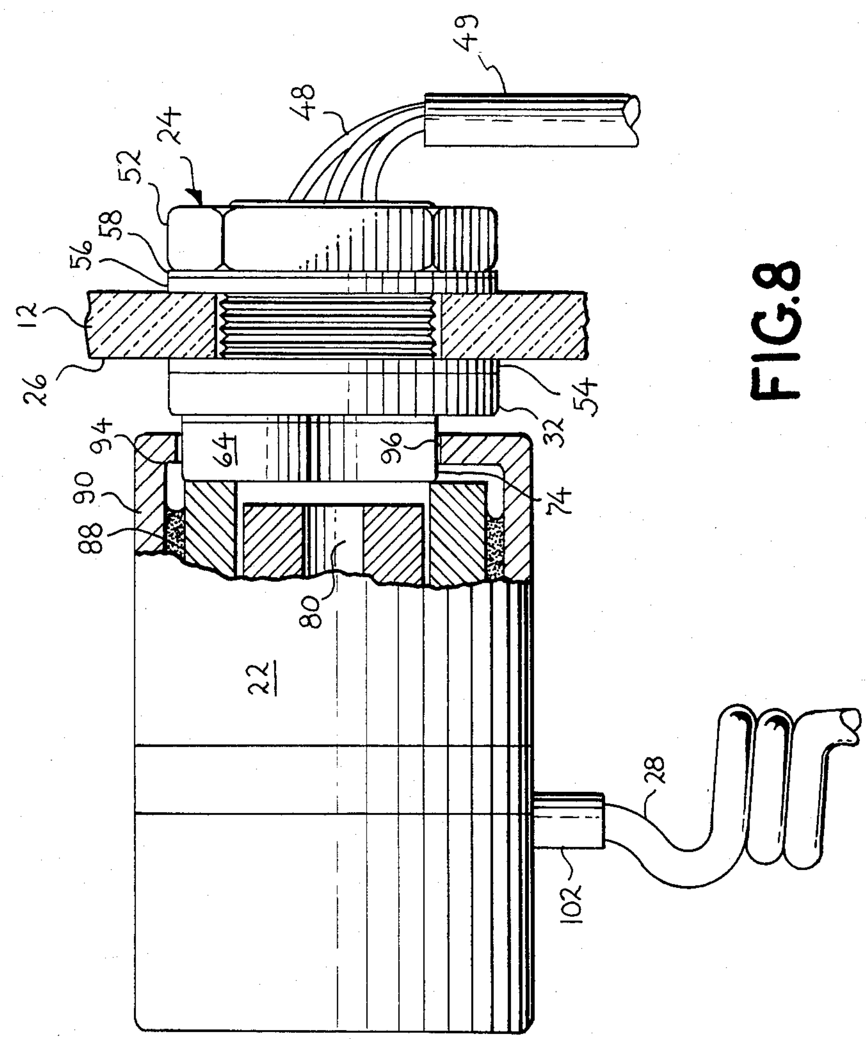
FIG. 8 is a side view, partly in cut-away and partly in cross-section, showing the first and second coupler assemblies of FIGS. 2 and 5, respectively, magnetically coupled for operation of the invention while communicating with a programmable meter.

The interrelationships between the first and second couplers 24 and 22 respectively is best illustrated by FIG. 8. FIG. 8 shows, in partial cutaway cross sectional side view, the relationship between the couplers 22 and 24 when they are magnetically attached. As there shown, the lip on cover 90, forming the light shield 94, closely surrounds the cover 64 to thereby provide a substantially enclosed environment for the optical communication devices to prevent or inhibit the entry of ambient light between the face portions of the coupler assemblies. Further, as can be seen in FIG. 8, the first and second coupler assemblies are always precisely aligned by the mating of the two alignment means 74 and 96, to thus ensure that the optical communication devices are always precisely aligned whenever the two coupler assemblies are magnetically attached.

As shown in FIG. 8, the structure of the shield and lip 94 is configured to closely surround the face portion 64 of the fixed coupler. This configuration enables the face portion of the fixed coupler to be inserted into the aforementioned flux path (air gap) of that part of the closed loop magnetic circuit formed between the lip of the cover and the magnetized end of the magnet. The insertion of the fixed coupler into the air gap provides an additional path for the magnetic flux to flow between the magnet and the cover via the inductive fixed coupler. This additional path is provided because of the close coupling of the shield (lip) and magnet to the fixed coupler assembly and serves to further increase the holding force of the magnetic coupler assembly when it is attached to the fixed coupler assembly by further closing the closed loop magnetic circuit.

The advantages of the present invention are believed to best be realized by the utilization of a pulse code or binary communication protocol. When using such a protocol, the emitter devices (such as diodes 38') are pulsed by electronic signals from their connected electronics to transmit light pulses across the communication link to their corresponding collector devices (such as photo transistors 38") which in turn convert those light pulses to electronic pulses for reception by the electronic circuitry to which the collector devices are connected. This type of communication protocol is particularly advantageous when used with meters which implement programmable micro processors which must be interrogated and programmed by an external device such as 18 of FIG. 1.

From the foregoing description of the invention, it will be apparent that further modifications and alternative embodiments of it may be made without departing from its teaching; accordingly, it is our intention to encompass within the following claims the true spirit and scope of the invention.

What is claimed is:

1. In a system of the type including a meter having electronic circuitry housed within a cover of the meter, the combination comprising:

(a) a fixed coupler assembly of magnetically inductive material rigidly mounted through a portion of the meter cover, said fixed coupler assembly having a face portion external of the meter cover and including an aperture extending into said fixed coupler assembly from the face portion, said fixed coupler assembly further including,
   (1) an optical communication means of a first type disposed in the aperture of said fixed coupler assembly for optical communication external of the meter cover at the face portion of said fixed coupler assembly, and
   (2) means connecting said optical communication means of said first type to the electronic circuitry for electronically communicating therewith;

(b) a magnetic coupler assembly comprising a magnet having a surface on one end thereof for mating attachment to the face portion of said fixed coupler assembly and including an aperture extending into said magnet from said surface, said aperture being positioned on said surface for alignment with the aperture in the face portion of said fixed coupler assembly when the surface end of said magnet is brought into mating attachment with the face portion of said fixed coupler assembly, said magnetic coupler assembly further including,
   (1) an optical communication means of a second type disposed in the aperture of said magnet for optical communication out the surface end thereof,
   (2) a cover of magnetically inductive material surrounding said magnet, said cover being inductively coupled to said magnet to thereby increase the magnetic holding force of said magnet by providing a closed loop magnetic circuit having a path for the magnetic flux generated by said magnet which flows between said cover and said magnet, said cover being formed with a shield surrounding said magnet in the form of a lip forming a part of the closed loop magnetic circuit and extending outward of the surface end of said magnet whereby the lip of said shield is formed to closely surround said fixed coupler assembly at the face portion thereof to, (i) effect alignment of the optical communication means of said first and second types, (ii) inhibit the entry of ambient light between the face portion and the surface end of said fixed coupler assembly and said magnet respectively, and (iii) enable said fixed coupler assembly to be inserted into the closed loop magnetic circuit to provide an additional path for magnetic flux to flow between said shield and said magnet, via said fixed coupler assembly, to thereby further increase the holding force of said magnetic coupler assembly against said fixed coupler assembly when said fixed and magnetic coupler assemblies are magnetically attached; and (c) external communication means connected to the optical communication means of said second type in said magnetic coupler assembly for electronically communicating information between the electronic circuitry in the meter cover and said external communication means, via the optical communication means of said first and second types, when said fixed and magnetic coupler assemblies are magnetically attached.

2. The system in accordance with claim 1, wherein one of the optical communication means of said first and second types is a light emitting diode and the other of said first and second types is a photocell.

3. The system in accordance with claim 1, wherein said fixed coupler assembly further includes a transparent protective shield on the face portion thereof for protecting the optical communication means disposed in the aperture of said fixed coupler assembly.

4. A meter that is designed to be linked for optical communication purposes via two coupler assemblies that are configured to be coupled together in preparation for such communication, said meter comprising a cover and means for mounting a single one of the following two coupler assemblies on the cover so that the mounted coupler assembly projects through the cover and is structured to cooperate with the other coupler assembly in the manner specified by the following combination comprising:

(a) a first coupler assembly including,
   (1) a body of magnetically inductive material having a face portion and including an aperture extending into said body from the face portion, and (2) an optical communication means of a first type disposed in the aperture of said body for optically communicating out the face portion of said body; and (b) a second coupler assembly including, (1) a magnet having a surface on one end thereof formed to magnetically couple said magnet to the face portion of said first coupler assembly and including an aperture extending into said magnet from said surface, said aperture being positioned on said surface for alignment with the aperture in the face portion of said first coupler assembly when the surface end of said magnet is brought into registry with the face portion of said first coupler assembly, (2) an optical communication means of a second type disposed in the aperture of said magnet for optical communication out the surface end thereof, and (3) a cover of magnetically inductive material surrounding said magnet, said cover being inductively coupled to said magnet to thereby increase the magnetic holding force of said magnet by providing a closed loop magnetic circuit having a path for the magnetic flux generated by said magnet which flows between said cover and said magnet, said cover being formed with a shield surrounding said magnet in the form of a lip forming a part of the closed loop magnetic circuit and extending outward of the surface end of said magnet whereby the lip of said shield is formed to closely surround said first coupler assembly at the face portion thereof to, (i) effect alignment of the optical communication means of said first and second types, (ii) inhibit the entry of ambient light between the face portion and the surface end of said first coupler assembly and said magnet respectively, and (iii) enable said first coupler assembly to be inserted into the closed loop magnetic circuit to provide an additional path for magnetic flux to flow between said shield and said magnet, via said first coupler assembly, to thereby further increase the holding force of said second coupler assembly against said first coupler assembly when said first and second coupler assemblies are magnetically attached.

5. In a meter of the type including electronic circuitry housed within a meter cover, apparatus for electronically communicating with the electronic circuitry externally of the meter cover comprising:

(a) a fixed coupler assembly of magnetically inductive material rigidly mounted through a portion of the meter cover, the structure of said fixed coupler assembly being characterized by a substantially cylindrical body having a substantially flat face portion on one end thereof external of the meter cover and including a first alignment means formed in the face portion of said body, said fixed coupler assembly being further characterized by first and second apertures extending through said body from the face portion end thereof, said fixed coupler assembly further including, (1) a first optical emitter device, (2) a first optical detector device, (3) means for mounting said first optical emitter and detector devices in the first and second apertures respectively of said body, whereby said first optical emitter and detector devices may optically communicate externally of the meter cover through the face portion of said fixed coupler assembly, and (4) means for electrically connecting said first emitter and detector devices to the electronic circuitry inside the meter cover; and (b) a detachable coupler assembly having a structure characterized by a substantially cylindrical magnet having a substantially flat magnetized surface on one end thereof formed for magnetic attachment to the face portion of said fixed coupler assembly, said magnet further being characterized by third and fourth apertures extending through said magnet from the magnetized surface end thereof and being positioned for alignment with the first and second apertures respectively in the face portion of said fixed coupler assembly, said detachable coupler assembly further including, (1) a second optical emitter device, (2) a second optical detector device, (3) means for mounting said second optical emitter and detector devices in the third and fourth apertures respectively of said magnet whereby said second optical emitter and detector devices may communicate through the third and fourth apertures respectively in the magnetized surface end of said magnet, and (4) a substantially cylindrical cover of magnetically inductive material circumventing said magnet, said cover being inductively coupled to said magnet to thereby increase the magnetic holding force of said magnet by providing a closed loop magnetic circuit having a path for the magnetic flux generated by said magnet which flows between said cover and said magnet, said cover being positioned on said magnet to form an annular lip extending beyond the magnetized surface end of said magnet and forming a part of the closed loop magnetic circuit, said lip being formed to closely surround the body of said first coupler assembly at the face portion thereof and including a second alignment means formed therein for mating engagement with said first alignment means in the face portion of said fixed coupler assembly to, (i) effect alignment of the apertures in the face portion and magnetized surface end of said fixed and detachable coupler assemblies respectively, whereby said first optical emitter device in said fixed coupler assembly communicates with said second optical detector device in said detachable coupler assembly, and said first optical detector device in said fixed coupler assembly communicates with said second optical emitter device in said detachable coupler assembly, (ii) inhibit the entry of ambient light between the face portion of said fixed coupler assembly and the surface end of said magnet respectively, and (iii) enable said fixed coupler assembly to be inserted into the closed loop magnetic circuit to provide an additional path for magnetic flux to flow between the lip of said cover and said magnet, via the body of said fixed coupler assembly, to thereby further increase the holding force of said magnetic coupler assembly against said fixed coupler assembly when said fixed and detachable coupler assemblies are magnetically attached to form an optical communication link for electronically communicating, externally of the meter cover, with the electronic circuitry inside the meter cover.

* * * * *